United States Patent
Cheng et al.

(10) Patent No.: US 8,975,675 B2
(45) Date of Patent: Mar. 10, 2015

(54) LOCALLY ISOLATED PROTECTED BULK FINFET SEMICONDUCTOR DEVICE

(71) Applicant: International Business Machines Corporation, Armonk, NY (US)

(72) Inventors: Kangguo Cheng, Schenectady, NY (US); Raghavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/166,219

(22) Filed: Jan. 28, 2014

(65) Prior Publication Data

US 2014/0145250 A1 May 29, 2014

Related U.S. Application Data

(62) Division of application No. 13/685,735, filed on Nov. 27, 2012, now Pat. No. 8,697,536.

(51) Int. Cl.
*H01L 29/78* (2006.01)
*H01L 21/76* (2006.01)
*H01L 29/16* (2006.01)

(52) U.S. Cl.
CPC .............. *H01L 29/785* (2013.01); *H01L 21/76* (2013.01); *H01L 29/16* (2013.01)
USPC ....................................................... 257/288

(58) Field of Classification Search
USPC ....................................................... 257/288
See application file for complete search history.

(56) References Cited

U.S. PATENT DOCUMENTS

| | | |
|---|---|---|
| 6,518,148 B1 | 2/2003 | Cheng et al. |
| 6,645,867 B2 | 11/2003 | Dokumaci et al. |
| 6,764,922 B2 | 7/2004 | Beyer et al. |
| 6,924,178 B2 | 8/2005 | Beintner |
| 6,989,318 B2 | 1/2006 | Doris et al. |
| 7,074,662 B2 | 7/2006 | Lee et al. |
| 7,265,014 B1 | 9/2007 | Hui et al. |
| 7,498,632 B2 | 3/2009 | Lee |
| 7,863,122 B2 | 1/2011 | Booth, Jr. et al. |
| 7,910,482 B2 | 3/2011 | Stephens et al. |
| 8,357,601 B2 | 1/2013 | Juengling |
| 2008/0085587 A1 | 4/2008 | Wells et al. |
| 2009/0315112 A1* | 12/2009 | Lee ............................... 257/355 |
| 2010/0176438 A1 | 7/2010 | Lue et al. |
| 2010/0264472 A1 | 10/2010 | Fehlhaber et al. |
| 2011/0068431 A1 | 3/2011 | Knorr et al. |
| 2011/0097863 A1 | 4/2011 | Shieh et al. |
| 2011/0248326 A1 | 10/2011 | Kanakasabapathy et al. |
| 2012/0032267 A1 | 2/2012 | Cheng et al. |
| 2013/0270652 A1* | 10/2013 | Liaw ............................. 257/401 |
| 2013/0292805 A1* | 11/2013 | Cai et al. ........................ 257/622 |
| 2014/0113432 A1* | 4/2014 | Ching et al. .................. 438/424 |

* cited by examiner

*Primary Examiner* — Thao P Le
(74) *Attorney, Agent, or Firm* — Cantor Colburn LLP; Steven Meyers

(57) ABSTRACT

A semiconductor device includes a bulk substrate having a plurality of trenches formed therein. The trenches define a plurality of semiconductor fins that are integral with the bulk semiconductor substrate. A local dielectric material is disposed in each trench and between each pair of semiconductor fins among the plurality of semiconductor fins. The semiconductor device further includes an etch resistant layer formed on the local dielectric material.

3 Claims, 9 Drawing Sheets

LOCALLY ISOLATED PROTECTED BULK FINFET SEMICONDUCTOR DEVICE

CROSS-REFERENCE TO RELATED APPLICATION

This application is a division of U.S. patent application Ser. No. 13/685,735, filed Nov. 27, 2012, the disclosure of which is incorporated by reference herein in its entirety.

BACKGROUND

The present disclosure relates generally to a FinFET semiconductor device, and more specifically, locally isolating semiconductor fins of a bulk semiconductor FinFET device.

Various conventional techniques exist for isolating source and drain regions included in FinFET semiconductor devices. One approach employs a silicon-on-insulator (SOI) semiconductor substrate, which includes a buried oxide (BOX) layer disposed between a bulk semiconductor layer and an active silicon layer. One or more semiconductor fins are formed on the active silicon layer such that the BOX isolates the source region from the drain region.

Another approach is to form one or more semiconductor fins on a bulk semiconductor substrate. To isolate the source region from the drain region, a dielectric material is deposited locally over and between the semiconductor fins. However, since the dielectric material is deposited on an outer surface of the fins and the semiconductor substrate, the dielectric material is exposed to the surrounding environment. Accordingly, the local dielectric material is susceptible to erosion during gate formation and spacer etching processes. Excess erosion of the dielectric material may increases the possibility of junction leakage at the gate.

SUMMARY

According to at least one embodiment of the present disclosure, a method of fabricating a semiconductor device comprises forming a plurality of trenches in a bulk semiconductor substrate, where each trench defines a semiconductor fin. A local dielectric material is deposited in the trenches and covers each semiconductor fin. The local dielectric material disposed in each trench is recessed a predetermined distance below the semiconductor fins. An etch resistant layer, which is resistant to at least one of a gate etching process and a spacer etching process, is formed on an upper surface of each recessed local dielectric material.

In another embodiment of the present disclosure, a method of isolating a plurality of semiconductor fins formed in a bulk semiconductor substrate comprises depositing a dielectric material between adjacent fins among the plurality of semiconductor fins. The dielectric material is recessed a predetermined distance below the fins to expose an upper surface. An etch resistant layer is selectively deposited on the upper surface of the local dielectric material.

In still another embodiment of the disclosure, a semiconductor device comprises a bulk semiconductor substrate having a plurality of trenches formed therein. The trenches define a plurality of semiconductor fins that are integrally formed from the bulk semiconductor substrate. A local dielectric material is disposed in each trench and between a pair of semiconductor fins among the plurality of semiconductor fins. An etch resistant layer is formed on the local dielectric material.

Additional features and utilities are realized through the techniques of the present disclosure. Other embodiments and utilities are described in detail herein and are considered a part of the claimed embodiments. For a better understanding of the features, refer to the following description and corresponding drawings illustrating various embodiments of the disclosure.

BRIEF DESCRIPTION OF THE SEVERAL VIEWS OF THE DRAWINGS

The following subject matter is particularly pointed out and distinctly claimed in the claims at the conclusion of the specification. The forgoing and other features of various embodiments of the disclosure are apparent from the following detailed description taken in conjunction with the accompanying drawings in which:

FIGS. 1-8 are a series of views illustrating a method of forming a finFET device according to exemplary embodiments of the present teachings, in which:

FIG. 1 is a cross sectional view of an initial bulk semiconductor substrate;

FIG. 2 illustrates the bulk semiconductor of FIG. 1 having a mandrel layer formed thereon;

FIG. 3 illustrates the bulk semiconductor substrate illustrated in FIG. 2 following an etching process that forms individual mandrels from the mandrel layer;

FIG. 4 illustrates the bulk semiconductor substrate including a plurality of semiconductor fins defined by patterning the semiconductor substrate illustrated in FIG. 3;

FIG. 5 illustrates the bulk semiconductor substrate illustrated in FIG. 4 after depositing a dielectric material between the fins;

FIG. 6 illustrates the bulk semiconductor substrate illustrated in FIG. 5 after recessing the deposited dielectric material;

FIG. 7 illustrates an atomic layer deposition process that introduces blocking copolymers to the bulk semiconductor substrate of FIG. 6;

FIG. 8 illustrates the bulk semiconductor substrate shown in FIG. 6 after selectively forming an protective etch resistant layer on the recessed dielectric material.

DETAILED DESCRIPTION

Figure 1:
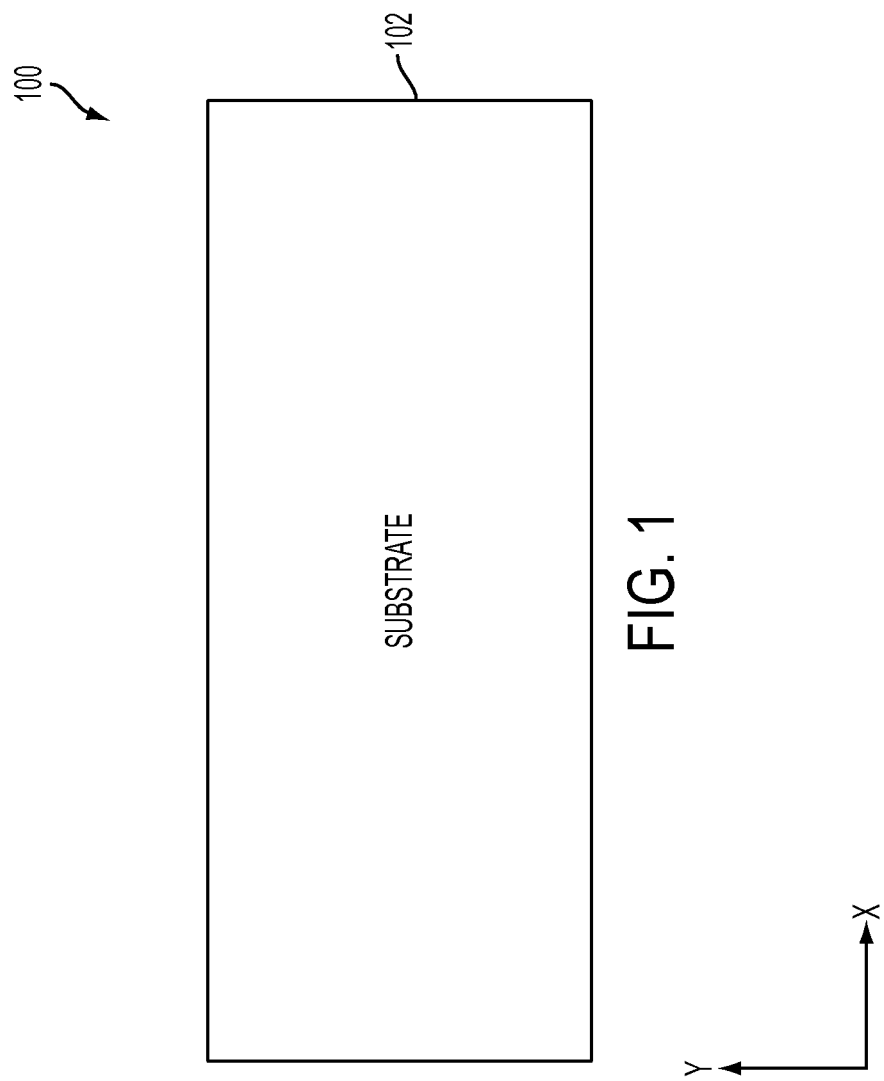
Figure 2:
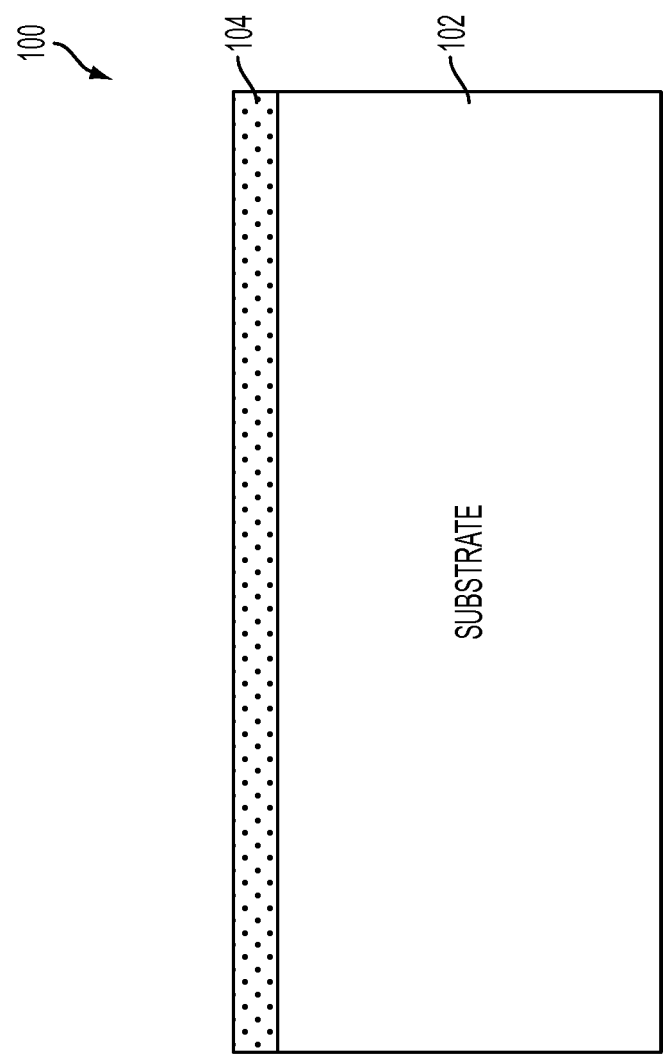

FIGS. 1 and 2 illustrate a semiconductor structure 100 according to at least one embodiment of the disclosure. The semiconductor structure 100 includes a bulk semiconductor substrate 102 extending along an X-axis to define a length, and a Y-axis perpendicular to the X-axis to define a height. The bulk semiconductor substrate 102 may be formed from a semiconductor material such as silicon (Si), for example. A mandrel layer 104 is formed on an upper surface of the bulk semiconductor substrate 102. The mandrel layer 104 can be formed by chemical vapor deposition (CVD) of silicon oxide ($SiO_2$) on the upper surface of the bulk semiconductor substrate 102. Further, the mandrel layer 104 may be formed from a material having a composition different from the bulk semiconductor substrate 102 to achieve an etching selectivity. The material of the mandrel layer 104 includes, but is not limited to, photoresist, polycrystalline silicon, silicon oxide, silicon nitride, and silicon germanium.

Figure 3:
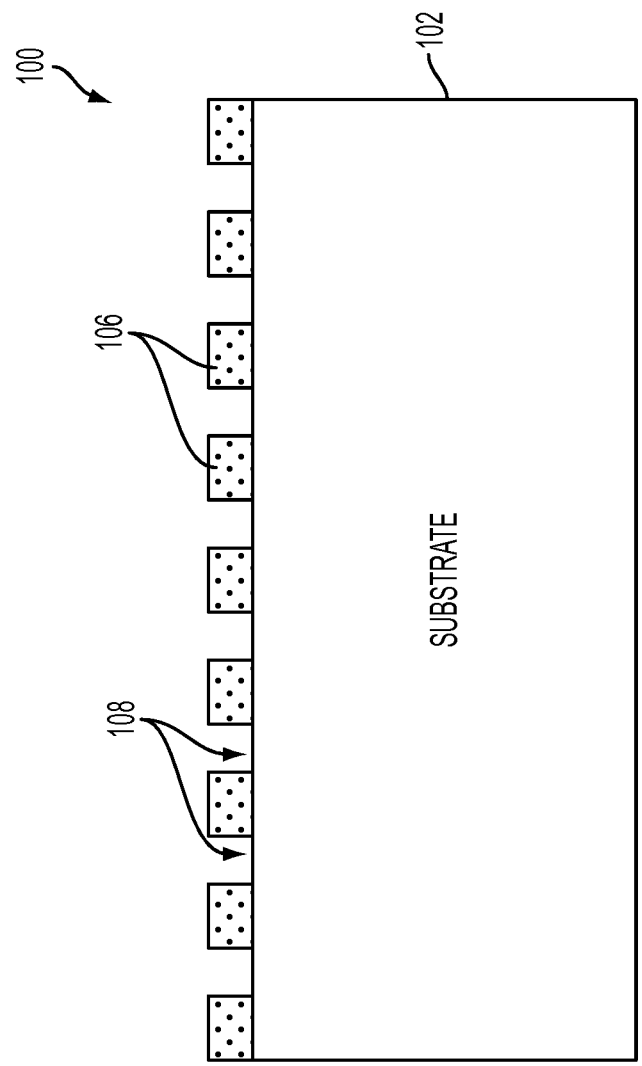
Figure 4:
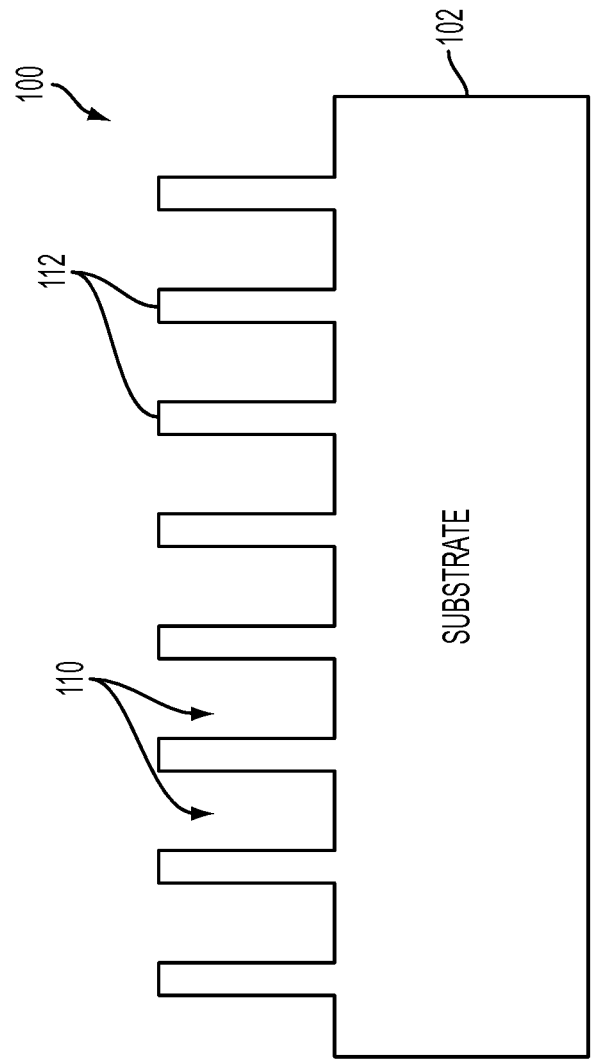

Referring now to FIG. 3, the mandrel layer 104 is patterned to form a plurality of individual mandrels 106. More specifically, a mandrel patterning mask (not shown) may be disposed on the surface of the mandrel layer 104. One or more portions of the mandrel layer 104 may be patterned according to the patterning mask using various processes including but not limited to, lithography, to form a plurality of trenches 108. Accordingly, each trench is separated from one another by an individual mandrel 106. A well-known sidewall image transfer (SIT) process may utilize the individual mandrels 106 to etch fin trenches 110 into the bulk semiconductor substrate 102, thereby defining one or more semiconductor fins 112, as illustrated in FIG. 4. Since the fins 112 are patterned into the bulk semiconductor substrate 102, the fins 112 and the semiconductor bulk substrate 102 are formed from the same material, such as Si. After forming the fins 112 in the bulk semiconductor substrate 102, the individual mandrels 106 may be removed from the semiconductor fins 112 as further illustrated in FIG. 4. Various procedures may be performed to remove the mandrels 106 including, but not limited to, an etch chemistry process.

Figure 5:
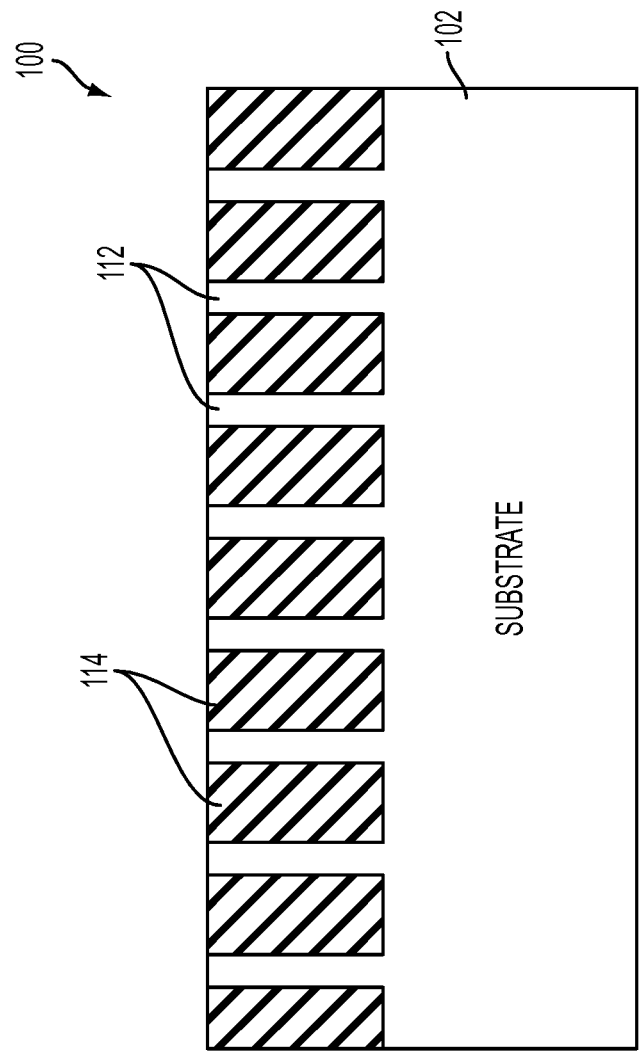
Figure 6:
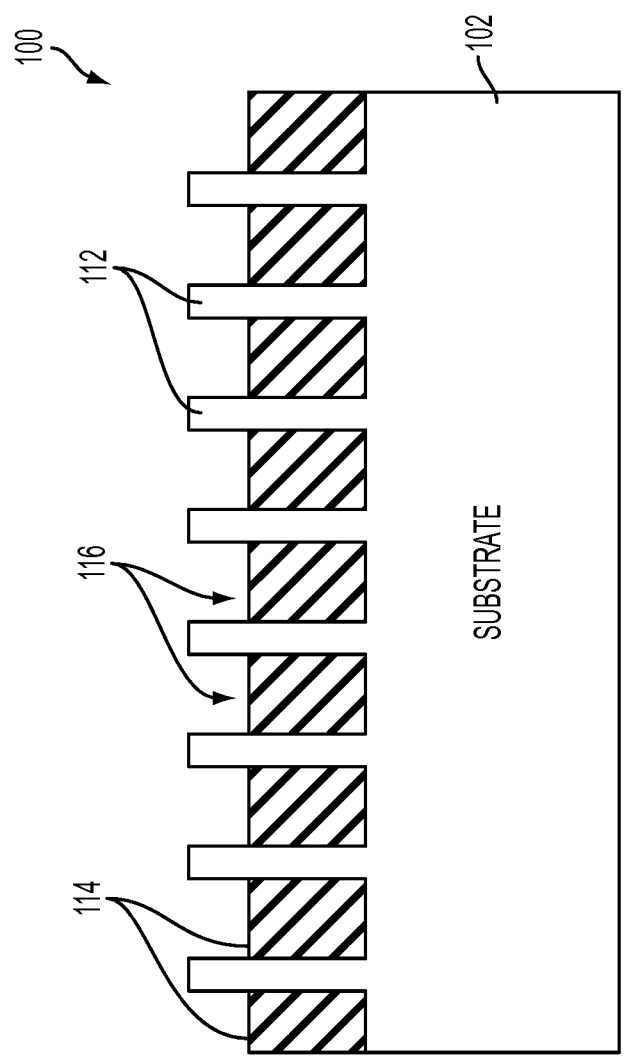

Referring now to FIG. 5, a local dielectric material 114, such as an oxide isolation material, is deposited in the fin trenches 110 to isolate a source region from a drain region. The local dielectric material 114 may be a high-aspect-ratio process (HARP) oxide material. In at least one embodiment, the local dielectric material 114 comprises silicon oxide ($SiO_2$). The process of depositing the local dielectric material 114 may include depositing the dielectric material 114 entirely over the fins 112 and then polishing back the dielectric material 114 until it is flush with the upper portions of the fins 112. The dielectric material 114 may then be recessed a predetermined distance below fins 112 such that a cavity 116 is formed between upper portions of adjacent fins 112 as illustrated in FIG. 6. In at least one embodiment, the dielectric material 114 is recessed about half-way below respective adjacent fins 112. Various processes may be used to form the cavities 116 including, but not limited to, corona etching and SiCoNi chemical etching.

After forming the cavities 116 to expose the fins 112 and an upper surface of the local dielectric material 114, the bulk semiconductor device 102 may undergo an atomic layer deposition (ALD) process to selectively form an etch resistant layer on the dielectric material 114. The etch resistant layer may serve as a protection layer that protects the underlying local dielectric material 114 from inadvertent erosion caused by gate and spacer etching and patterning processes. The etch resistant layer may have a thickness from about 2 nanometers (nm) to about 6 nm. Further, the etch resistant layer may be etched according to an etching process that is different from conventional etching processes utilized to pattern a gate region and/or spacers of in bulk semiconductor devices. Various methods to form the etch resistant layer on the dielectric material 114 may be employed, as discussed in greater detail below.

Figure 7:
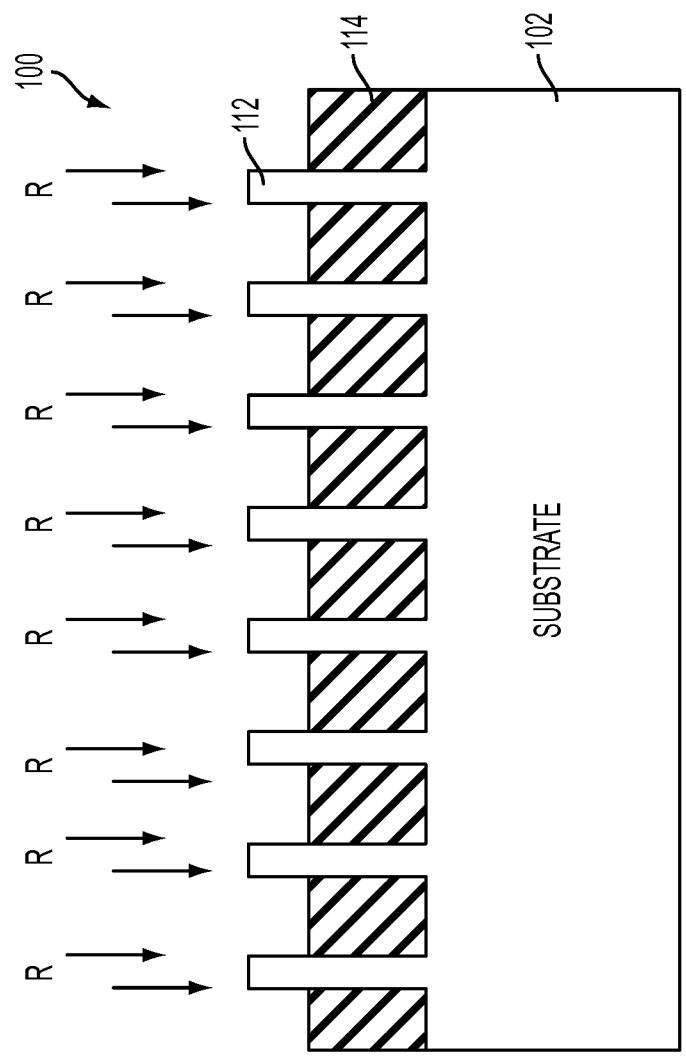
Figure 8:
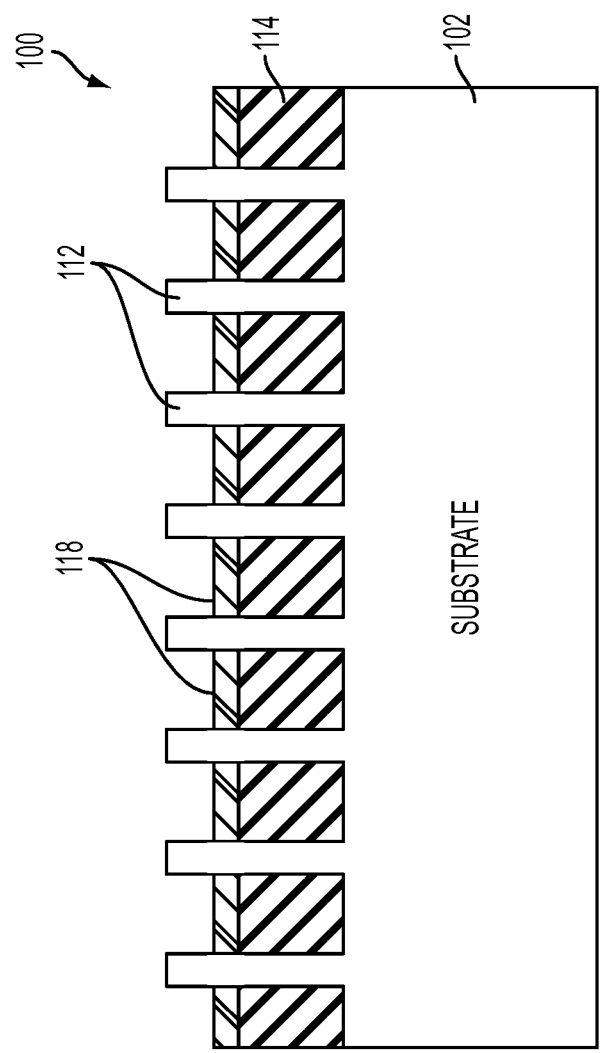

Referring to at least one embodiment illustrated in FIGS. 7-8, an ALD positive patterning process is applied to an upper surface of the recessed dielectric material 114. In at least one embodiment, the ALD positive patterning process is applied to bulk semiconductor substrate formed from a hydrogen terminated material such as Si, and a local dielectric material 114 comprising a HARP oxide material such as silicon oxide ($SiO_2$). As specifically illustrated in FIG. 7, the positive patterning ALD process employs blocking copolymers (R) that attach to elements of the semiconductor bulk substrate 102 formed from the Si, such as the semiconductor fins 112. The blocking copolymers (R) resist growth of high dielectric constant (high-k) materials including, but not limited to, $HfO_2$. Accordingly, an etch resistant layer 118, which withstands etching and patterning processes utilized in gate and spacer patterning, may be selectively formed on the recessed dielectric material 114 as shown in FIG. 8. That is, the blocking copolymers (R) selectively block an etch resistant layer 118 comprising a high-k material from forming on Si regions of the bulk semiconductor substrate 102 such as the fins 112, while the etch resistant layer 118 is allowed to form on areas excluding the blocking co-polymers (R) such as the dielectric material 114. Accordingly, the etch resistant layer may protect the dielectric material 114 from erosion caused by subsequent etching and pattering. Moreover, since erosion of the dielectric material is prevented, the thru pitch control at the gate may be improved such that junction leakage is reduced.

In another embodiment, the $HfO_2$ etch resistant layer 118 is grown on an upper surface of a HARP oxide dielectric material 114 using nucleation ALD. More specifically, a high-k material such as $HfO_2$ is responsive to nucleation on both a chemical oxide material such as Si—O—H and a thermal oxide material such as $SiO_2$ and Si—O—N, while being inherently resistive to nucleation, i.e., growth, on hydrogen terminated material, such as Si. Accordingly, an etch resistant layer 118 comprising $HfO_2$ may be selectively grown on the semiconductor bulk substrate 102. More specifically, the etch resistant layer 118 may be grown on the local dielectric material 114 comprising SiO2, while the $HfO_2$ is inhibited from growing on Si regions such as the semiconductor fins 112. Accordingly, the $HfO_2$ etch resistant layer 118 protects the underlying local dielectric material 114 from erosion caused by gate pattering/etching, spacer etching, replacement metal gate (RMG), fin epitaxy deposition SiCoNi pre-cleaning, etc.

Figure 9:
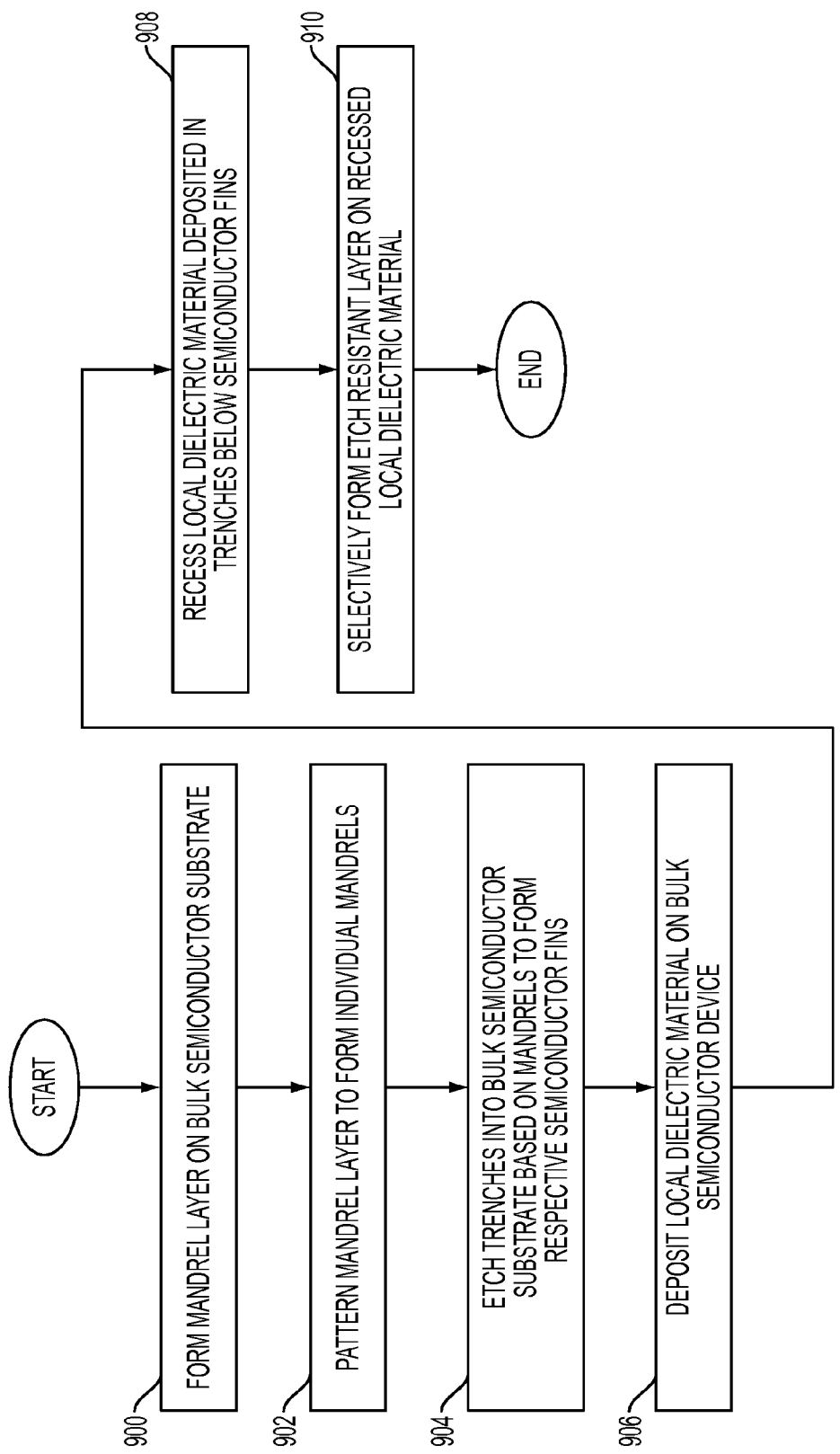
FIG. 9 is a flow diagram illustrating a method of fabricating a semiconductor device according to an embodiment of the disclosure.

Referring now to FIG. 9, a flow diagram illustrates a method of fabricating a semiconductor device according to an embodiment of the disclosure. At operation 900, a mandrel layer is formed on a bulk semiconductor substrate. The mandrel layer is patterned at operation 902 to form a plurality of individual mandrels. Various pattern processes may be applied to the mandrel layer including, but not limited to, lithography. At operation 904, a plurality of trenches is patterned along the sides of the mandrels and into the bulk semiconductor substrate. The mandrels may be subsequently removed after the trenches are formed, thereby leaving a plurality of semiconductor fins formed integrally from the bulk semiconductor substrate. At operation 906, a local dielectric material, i.e., an oxide isolation material such as $SiO_2$, is deposited on the bulk semiconductor substrate and in the trenches. The local dielectric material deposited in the trenches is recessed below the semiconductor fins at operation 908. At operation 910, an etch resistant layer is selectively deposited on the recessed local dielectric material and the method ends. Accordingly, an etch resistant layer may be selectively formed on the semiconductor device to protect the local dielectric material from subsequent etching processes such as a poly carbon gate etching process and a spacer etching process, which are conventionally applied to semiconductor device.

The terminology used herein is for the purpose of describing various embodiments only and is not intended to limit the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The flow diagrams depicted herein are just one example. There may be many variations to this diagram or operations described therein without departing from the spirit of the embodiments. For instance, the operations may be performed in a differing order, or operations may be added, deleted or modified. All of these variations are considered a part of the claimed embodiments.

While various embodiments of the disclosure are described, it will be understood that those skilled in the art, both now and in the future, may make various modifications which fall within the scope of the following claims. These claims should be construed to maintain the proper protection of the various embodiments described herein.

The invention claimed is:

1. A semiconductor device, comprising:
   a bulk semiconductor substrate;
   a plurality of trenches formed in the bulk semiconductor substrate, the trenches defining a plurality of semiconductor fins that are integral with the bulk semiconductor substrate;
   a local dielectric material disposed in each trench and between each pair of semiconductor fins among the plurality of semiconductor fins; and
   an etch resistant layer formed on the local dielectric material,
   wherein the etch resistant layer is formed only on the local dielectric material.

2. The semiconductor device of claim 1, wherein the bulk semiconductor substrate is formed from a hydrogen terminated material, the local dielectric material is formed from a high-aspect-ratio process (HARP) oxide material and the etch-resistant layer is formed from a high dielectric (high-k) material.

3. The semiconductor device of claim 2, wherein the hydrogen terminated material is silicon (Si), the HARP oxide material is $SiO_2$ and the high-k material is $HfO_2$.

* * * * *